United States Patent [19]

Blonder et al.

[11] Patent Number: 5,307,434
[45] Date of Patent: Apr. 26, 1994

[54] ARTICLE THAT COMPRISES A LASER COUPLED TO AN OPTICAL FIBER

[75] Inventors: Greg E. Blonder, Summit; William M. MacDonald, Stockton, both of N.J.

[73] Assignee: AT&T Bell Laboratories, Murray Hill, N.J.

[21] Appl. No.: 914,782

[22] Filed: Jul. 16, 1992

[51] Int. Cl.$^5$ .................................. G02B 6/42
[52] U.S. Cl. .................................. 385/91; 385/92
[58] Field of Search ........................ 385/88, 90, 91, 92

[56] References Cited

U.S. PATENT DOCUMENTS

| | | | |
|---|---|---|---|
| 4,210,923 | 7/1980 | North et al. | 385/88 |
| 4,466,696 | 8/1984 | Carney | 385/88 |
| 4,702,547 | 10/1987 | Enochs | 350/96.2 |
| 4,702,556 | 10/1987 | Ishii et al. | 385/91 |
| 4,741,796 | 5/1988 | Althaus et al. | 385/91 |
| 4,798,439 | 1/1989 | Preston | 350/96.20 |
| 4,807,956 | 2/1989 | Tournereau et al. | 350/96.20 |
| 4,844,581 | 7/1989 | Turner | 350/96.20 |
| 4,897,671 | 1/1990 | Mahapatra et al. | 385/130 |

FOREIGN PATENT DOCUMENTS 2582413 11/1986 France.
63-285505 11/1988 Japan.

OTHER PUBLICATIONS

"A Packaging Technique to Achieve Stable Single-Mode Fiber to Laser Alignment", by S. Enochs, Proceedings of SPIE, The International Society for Optical Engineering, vol. 703, D. H. Hartman et al (Chairs/Editors), (1986), pp. 42-47.

Primary Examiner—Frank Gonzalez
Attorney, Agent, or Firm—Eugen E. Pacher

[57] ABSTRACT

Disclosed is a laser/fiber mount that can advantageously be used in laser transmitter packages for a variety of purposes, including pump laser packages for optically amplified optical fiber transmission systems and fiber-to-the-home systems. Both laser and fiber are attached to the same unitary body, preferably a Si body. An integral heater serves to melt a quantity of solder that serves to bond the fiber to the body after alignment of the fiber to the laser. A relatively thick dielectric layer underneath the heater provides a large thermal impedance, insuring that the temperature of the unitary body is at least 50° C. (preferably 150° C.) less than that of the solder.

9 Claims, 2 Drawing Sheets

ARTICLE THAT COMPRISES A LASER COUPLED TO AN OPTICAL FIBER

FIELD OF THE INVENTION

This invention pertains to optical fiber laser transmitters.

BACKGROUND OF THE INVENTION

Optical fiber laser transmitters (i.e., packages that contain a semiconductor laser that is optically coupled to an optical fiber, typically a single mode fiber, that extends from the package) can be found in most, if not all, optical fiber communication systems. Such transmitters will almost certainly also be part of fiber-to-the-home communication systems. In view of the widespread current and future use of optical fiber laser transmitters it is important to have available a package design that can be economically and reliably manufactured and that yields a simple, thermally and mechanically stable single mode fiber transmitter package. This application discloses such a design.

The prior art knows many different transmitter designs, including many that utilize an integral resistor as heat source for solder bonding a component (typically the optical fiber) to a mounting part in the package. However, the prior art designs typically fall short of the above mentioned design goals. For instance, prior art designs typically comprise a multiplicity of piece parts, frequently including a variety of materials. Such designs typically are relatively difficult to assemble, require maintenance of close tolerances, and tend to be subject to thermal drift, due to differences in thermal expansion coefficients. Those skilled in the art will know that displacement of the, typically lensed, single mode fiber end by a mere fraction of a micron from the position of maximum coupling can result in significant loss of coupling efficiency.

Exemplary of prior art designs are U.S. Pat. Nos. 4,702,547; 4,798,439; 4,807,956; and 4,844,581; French patent publication No. 2,582,413 (publication date Nov. 28, 1986); Japanese patent 63-285,505/1988, and D. H. Hartman et al., *Proceedings of SPIE*, Vol. 703, p. 42 (1986). For instance, the '956 patent shows a laser (5) mounted on a base (15), with the base mounted on a substrate (13). The fiber is attached to a "sandwich" (14) on the substrate (13), with the sandwich consisting of an insulating layer (23), a resistor (24), a further insulating layer (25), and a metallic layer (26). A slit (16) provides some thermal isolation between the resistor (24) and the laser mount. As a further example, the '581 patent discloses a laser (33) mounted on a header (34) on ceramic substrate (1), and the fiber (36A) is attached by means of solder (7) to a multilayer feature (see FIG. 2 of the patent) that is disposed on substrate 1. The multilayer feature consists of screen printed thick films. Consequently, the thickness of the feature typically is difficult to control.

SUMMARY OF THE INVENTION

In a general sense the invention is an article that comprises an optical fiber laser transmitter of particularly advantageous design.

More specifically, the transmitter comprises a unitary substrate body which, in a preferred embodiment, is a unitary Si body. However, other substrate bodies, including a synthetic diamond body, or a body with a diamond film thereon, are contemplated. (Thus, a body herein is "unitary" not only if it consists entirely of the same material but also if it consists of more than one material, provided it is mechanically a single body.) Desirably such a unitary substrate body comprises material having high thermal conductivity (e.g., greater than 1 watt/cm.° K). A semiconductor laser is attached to the surface of the substrate body, typically by means of solder, such that the laser is in good thermal contact with the substrate. Contact means are provided that facilitate flowing an electrical current through the laser such that the laser emits electromagnetic radiation of predetermined wavelength. The transmitter further comprises a length of optical fiber, typically single mode fiber, with an end of the fiber attached to the substrate body by bonding means, and still further comprises resistive heating means that are adapted for melting at least a part of said bonding means.

Significantly, at least a part of the substrate is covered by a (relatively thick) first dielectric (e.g., $SiO_2$, $Si_3N_x$) layer, and the laser is attached to a part of the substrate that is not covered by the first dielectric layer. The heating means comprise a patterned first metal (e.g. Cr, Mo, Ta) layer that is disposed on the first dielectric layer. Heater contacts are provided and facilitate flowing a heating current through the first metal layer.

The bonding means comprise a bonding layer that is disposed on the first metal layer, and the thickness of the first dielectric layer is selected such that a temperature difference of at least 50° C. exists between the first metal layer and the substrate when the heating means are melting at least a portion of the bonding layer.

In exemplary embodiments of the invention the bonding layer comprises an electrically insulating solder glass layer that covers a portion of the first metal layer, or it comprises an electrically conductive solder glass layer that is overlying a patterned second dielectric (e.g., $SiO_2$, $Si_3N_x$) layer that covers a portion of the first metal layer. In a further exemplary embodiment the bonding layer comprises a second dielectric layer as described above, and further comprises a patterned second metal layer that is disposed on the second dielectric layer and comprises solder, and typically further comprises a metallization layer.

DETAILED DESCRIPTION OF A PREFERRED EMBODIMENT

Figure 1:
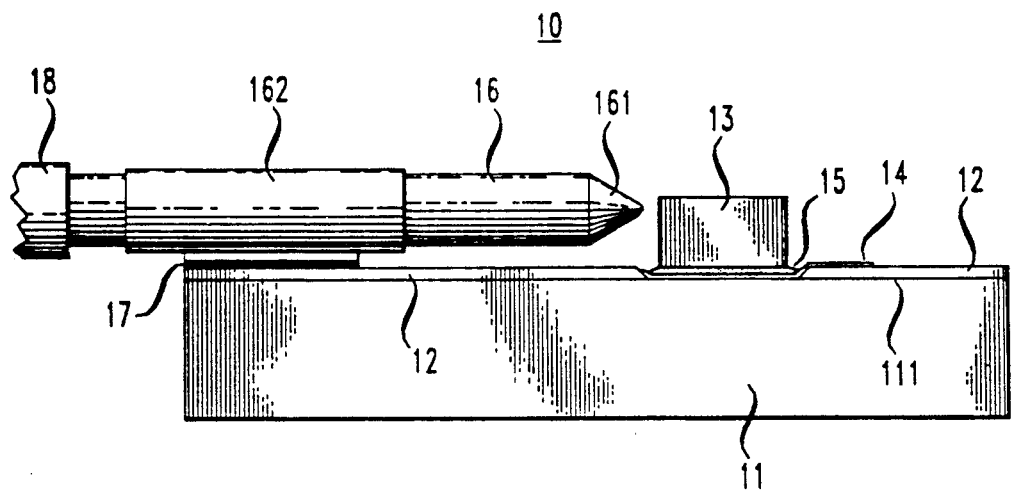
FIG. 1 schematically depicts the relevant portion of an exemplary optical fiber laser transmitter according to the invention.
Figure 2:
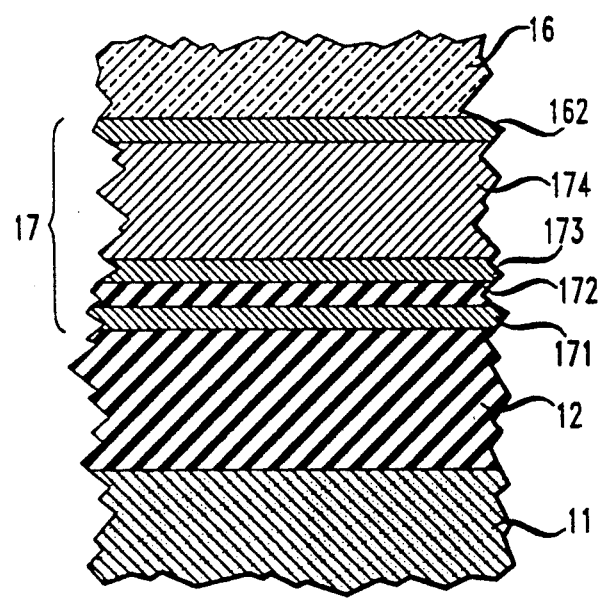
FIG. 2 schematically shows in greater detail a portion of FIG. 1.

FIG. 1 schematically shows the relevant parts of a currently preferred embodiment of the invention. The illustrated subassembly (10) can be mounted in conventional manner in a conventional housing, substantially as shown, for instance, in U.S. Pat. No. 4,844,581. Substrate 11 preferably is a Si body (exemplarily of dimensions 2.5×2.5×0.45 mm). Surface 111 is partially covered by relatively thick (e.g., 20 μm) $SiO_2$ layer 12. In a window in 12 is mounted, active side up, conventional laser 13. The exposed portion of 111 advantageously is metallized (e.g., by means of conventional TiPtAu metallization; those skilled in the art know that "TiPtAu" signifies a three-layer stack) to improve solder bonding (e.g., by means of conventional AuSn solder). The (multilayer) metalization layer and the solder layer are designated 14 and 15, respectively. As those skilled in the art will recognize, bonding the laser directly, without intervening dielectric layer, to the Si substrate inter alia facilitates heat transfer from the laser to the substrate. The metalization layer 14 advantageously extends onto $SiO_2$ layer 12 to facilitate electrically contacting the laser. The second laser contact is conventional and is not shown.

The end of single mode optical fiber 16 advantageously is lensed (161) to increase the coupling efficiency, and a portion of the fiber advantageously is metallized to facilitate solder bonding of the fiber to the substrate. The metallization layer (162) exemplarily is conventional NiAu. Numeral 17 refers to a multilayer stack, and 18 to conventional feed-through/strain relief means that do not require detailed description. See, for instance, the '581 patent.

Multilayer stack 17 comprises an appropriate patterned metal layer 171, forming a strip heater. Thus, the metal will typically have relatively low conductivity and relatively high melting point, and the thickness will be selected such that the required ohmic heat can be generated in the strip heater by means of a conveniently-sized current. Currently preferred is a 0.3 μm thick Cr layer. On the strip heater is situated the bonding layer. In the preferred embodiment the bonding layer is a multilayer stack that comprises a relatively thin (e.g., 0.5 μm) dielectric layer 172 (advantageously $SiO_2$) that prevents shorting of the heater. The dielectric layer is patterned such that terminal portions of layer 171 are exposed and accessible, such that heating current can be caused to flow through the strip heater. Optional metalization layer 173 (exemplarily conventional TiPtAu) is advantageously provided to facilitate solder bonding of the optical fiber to the substrate. In the currently preferred embodiment solder layer 174 is conventional AuSn solder. Electrically conducting glass solder could also be used. In the second, currently not preferred embodiment, the bonding layer comprises a layer of electrically insulating glass solder.

$SiO_2$ layer 12 presents a large thermal impedance, and thus serves to substantially localize the heat from the strip heater. The temperature difference across layer 12 can be estimated by means of the expression $\Delta T = (j^2 t_1 t_2 p)/\kappa$, wherein j is the current density in the strip heater, $t_1$ and $t_2$ are the $SiO_2$ layer thickness and strip heater thickness, respectively, p is the resistivity of the strip heater, and $\kappa$ is the thermal conductivity of $SiO_2$. Exemplarily, a 0.3 μm thick Cr strip heater, of width 0.4 mm, on a 20 μm $SiO_2$ layer, can raise the temperature of solder 174 to about 320° C. if the heater current is 1 Amp. The Si substrate temperature is about 140° C. under these conditions.

Among the advantages of the inventive design is the possibility of placing the fiber bond site very close (exemplarily about 0.7 mm) to the laser. This inter alia typically results in increased stability of the final assembly over its lifetime of use. Also among the advantages is the fact that there is very little difference in the height variation of fiber axis and laser active region when the temperature changes. This facilitates stable coupling between laser and fiber, and reduces the possibility of misalignment during cooling from the soldering temperature. For instance, for a conventional 80 μm high InP laser and the above described preferred embodiment (with layer 12, 14, 15, 171, 172, 173 and 174, and 162 thicknesses being, respectively, 20, 1, 25, 0.3, 0.5, 1, 25 and 1 μm), the fiber being a standard (125 μm outer diameter) $SiO_2$-based single mode fiber, there can be as little as about 0.02 μm laser/fiber misalignment in cooling from the soldering temperature to room temperature.

The preferred method of making a preferred article according to the invention comprises providing a substrate as described, with the laser bonded thereto, and with patterned layers 171-174 on $SiO_2$ layer 12. The strip heater is energized such that solder 174 melts, and the laser is energized to emit radiation. A conventional 3-axis piezo-driven manipulator stage can be used to align the fiber to the laser, with a conventional power meter serving to measure the power coupled into the fiber. When maximum power is attained, the power to the strip heater is turned off and the alignment is frozen. In some cases, re-melting of the solder may be required to achieve maximum coupling. This can be readily accomplished in the inventive design. Fiber bonds have been made with both 63:37 PbSn and 80:20 AuSn. Other solders, including solder glass, can also be used. Due to typically unavoidable thermal stresses between fiber and solder, attention typically should be paid to proper stress relief of the fiber after bonding.

Si bodies useful in the practice of the invention can readily be cut from standard Si wafers. The thick $SiO_2$ layer on the Si surface can be formed by a conventional process, e.g., high pressure (20 atmospheres) oxidation in steam. The various metallization layers, and the other metal layers of stack 17 can be deposited by conventional means, e.g., sputter deposition. Insulator layer 172 can also be deposited by conventional means. Patterning of the layers can be by conventional means, e.g., lithography and etching.

Figure 3:
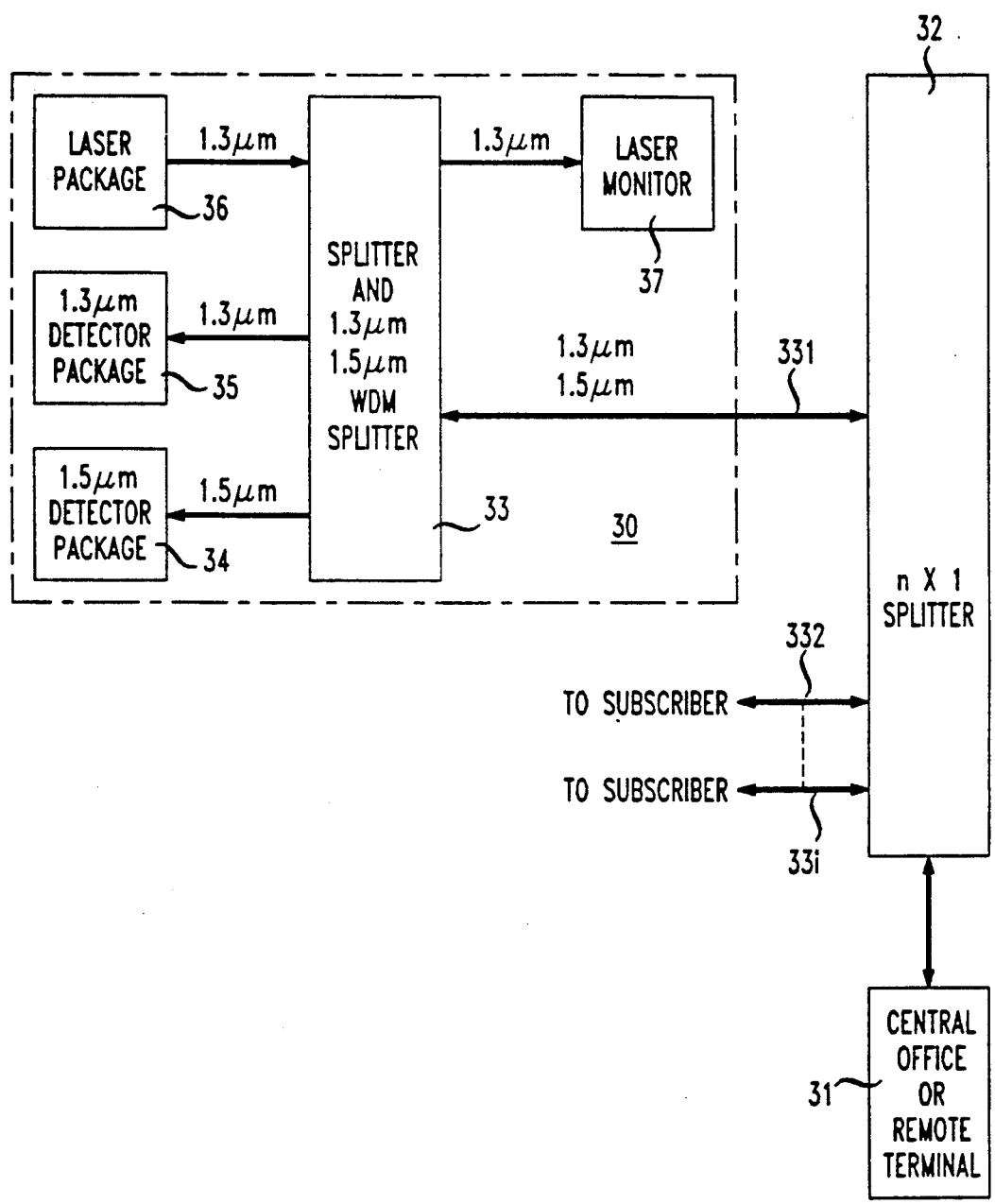
FIG. 3 shows schematically an exemplary article according to the invention, namely, an optical fiber communication system that comprises a multiplicity of laser transmitters according to the invention.

FIG. 3 schematically shows the relevant part of an exemplary optical fiber communication system that comprises a multiplicity of laser transmitters according to the invention. In particular, the figure depicts major features of one subscriber's portion 30 of an exemplary multisubscriber fiber-to-the-home two-way communication system. Feature 31 is the central office or a remote terminal, linked to the central office by means of optical fiber. Splitter 32 serves to split the signal from 31 into n signals, and to combine the return signals from lines 331-33$i$ (i≦n). Each line can carry signals at 1.3 μm and 1.5 μm. Splitter 33 (typically located on the subscriber premises) separates the incoming signals according to their wavelength. Detectors 34 and 35 each receive an optical signal and form therefrom an electrical signal by conventional means. The electrical signals are then fed to appropriate apparatus, not shown. Laser transmitter package 36 receives an electrical signal from appropriate apparatus (not shown), and produces an outgoing optical signal in response to the electrical input. The transmitter package is a package according to the invention, comprising a laser coupled to an optical fiber in the manner described. Laser monitor 37 receives radiation from the laser and serves to monitor laser operation.

We claim:

1. An article comprising an optical fiber laser transmitter that comprises
   a) a substrate;
   b) a semiconductor laser attached to the substrate;

c) contact means that are adapted for flowing an electrical current through the laser such that the laser emits electromagnetic radiation of predetermined wavelength;

d) a length of optical fiber, with an end of said fiber attached to said substrate by bonding means, with said end positioned such that electromagnetic radiation emitted from the laser is received by the optical fiber; and e) resistive heating means adapted for melting at least a part of said bonding means; characterized in that f) the substrate is a unitary body having a major surface, with at least a part of the major surface covered with a first dielectric layer;

g) the laser is attached to a part of said surface that is not covered by the first dielectric layer;

h) said heating means comprise a first patterned metal layer that is disposed on the first dielectric layer, and comprises heater contact means that facilitate flowing an electrical current through said first metal layer;

i) a bonding layer is disposed on said first metal layer; and j) the thickness of the first dielectric layer is selected such that a temperature difference of at least 50° C. exists between the first metal layer and the substrate when the heating means are melting at least a portion of the bonding layer.

2. An article according to claim 1, wherein the unitary substrate body is a Si body, and wherein the first dielectric layer is a $SiO_2$ layer.

3. An article according to claim 1, wherein the unitary substrate body comprises synthetic diamond.

4. An article according to claim 1, wherein said bonding layer comprises a solder glass layer that covers a portion of said first metal layer.

5. An article according to claim 4, wherein said bonding layer comprises a patterned second dielectric layer that covers a portion of said first metal layer, with said solder glass layer overlying said second dielectric layer.

6. An article according to claim 1, wherein said bonding layer comprises a patterned second dielectric layer that covers a portion of said first metal layer, and further comprises a patterned second metal layer that is disposed on said second dielectric layer and comprises solder.

7. An article according to claim 6, wherein the second metal layer further comprises a metalization layer.

8. An article according to claim 7, wherein the metalization layer comprises Ti, Pt and Au.

9. An article according to claim 6, wherein the unitary substrate body is a Si body, wherein both the first and the second dielectric layers are $SiO_2$ layers, wherein the second metal layer comprises a patterned metalization layer that overlies the second $SiO_2$ layer, wherein the thickness of the first $SiO_2$ layer is selected such that said temperature difference is at least 150° C., and wherein the optical fiber is a silica-based single mode optical fiber.

* * * * *